(12) United States Patent
Akiyoshi

(10) Patent No.: US 9,806,104 B2
(45) Date of Patent: *Oct. 31, 2017

(54) DISPLAY DEVICE AND MANUFACTURING METHOD THEREOF

(71) Applicant: JAPAN DISPLAY INC., Minato-ku (JP)

(72) Inventor: Muneharu Akiyoshi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 3 days.

This patent is subject to a terminal disclaimer.

(21) Appl. No.: 14/862,303

(22) Filed: Sep. 23, 2015

(65) Prior Publication Data

US 2016/0013218 A1 Jan. 14, 2016

Related U.S. Application Data

(63) Continuation of application No. 14/097,927, filed on Dec. 5, 2013, now Pat. No. 9,177,977.

(30) Foreign Application Priority Data

Dec. 19, 2012 (JP) .................................. 2012-276969

(51) Int. Cl.
*H01L 29/04* (2006.01)
*H01L 27/12* (2006.01)
(Continued)

(52) U.S. Cl.
CPC ........ *H01L 27/1248* (2013.01); *G02F 1/1339* (2013.01); *G02F 1/1368* (2013.01);
(Continued)

(58) Field of Classification Search
CPC .................................................. H01L 27/1248
(Continued)

(56) References Cited

U.S. PATENT DOCUMENTS 5,815,231 A * 9/1998 Nishi .................. G02F 1/13392
349/151
2001/0040665 A1* 11/2001 Ahn ...................... G02F 1/1368
349/156

(Continued)

FOREIGN PATENT DOCUMENTS

| JP | 2007-219235 | 8/2007 |
|---|---|---|
| JP | 2007-304452 A | 11/2007 |
| WO | WO 2011/058796 A1 | 5/2011 |

OTHER PUBLICATIONS

Office Action dated Nov. 17, 2015 in Japanese Patent Application No. 2012-276969 (with English language translation).

*Primary Examiner* — Ajay K Arora
(74) *Attorney, Agent, or Firm* — Oblon, McClelland, Maier & Neustadt, L.L.P.

(57) ABSTRACT

According to one embodiment, a display device includes a first substrate including a first insulative substrate, an outer peripheral wiring formed above the first insulative substrate, an insulation film disposed on the outer peripheral wiring, a pixel electrode formed on the insulation film in an active area for displaying an image, and a first bank formed in a line shape on the insulation film in a peripheral area surrounding the active area, a second substrate including at least a second insulative substrate, and a sealant which is provided in a manner to envelop the first bank, and which attaches the first substrate and the second substrate.

14 Claims, 4 Drawing Sheets

(51) Int. Cl.
*G02F 1/1339* (2006.01)
*G02F 1/1362* (2006.01)
*G02F 1/1368* (2006.01)
*G02F 1/1345* (2006.01)

(52) U.S. Cl.
CPC ...... *G02F 1/136286* (2013.01); *H01L 27/124* (2013.01); *H01L 27/1222* (2013.01); *H01L 27/1262* (2013.01); *G02F 2001/13456* (2013.01)

(58) Field of Classification Search
USPC .......................................................... 257/59
See application file for complete search history.

(56) References Cited

U.S. PATENT DOCUMENTS

| | | |
|---|---|---|
| 2007/0046886 A1 | 3/2007 | Yamaguchi et al. |
| 2007/0070284 A1* | 3/2007 | Lee ..................... G02F 1/13394 349/153 |
| 2007/0182912 A1 | 8/2007 | Kobayashi et al. |
| 2009/0231534 A1 | 9/2009 | Morita |
| 2011/0018008 A1* | 1/2011 | Lee ..................... H01L 51/5237 257/88 |
| 2014/0159074 A1 | 6/2014 | Isobe |

* cited by examiner

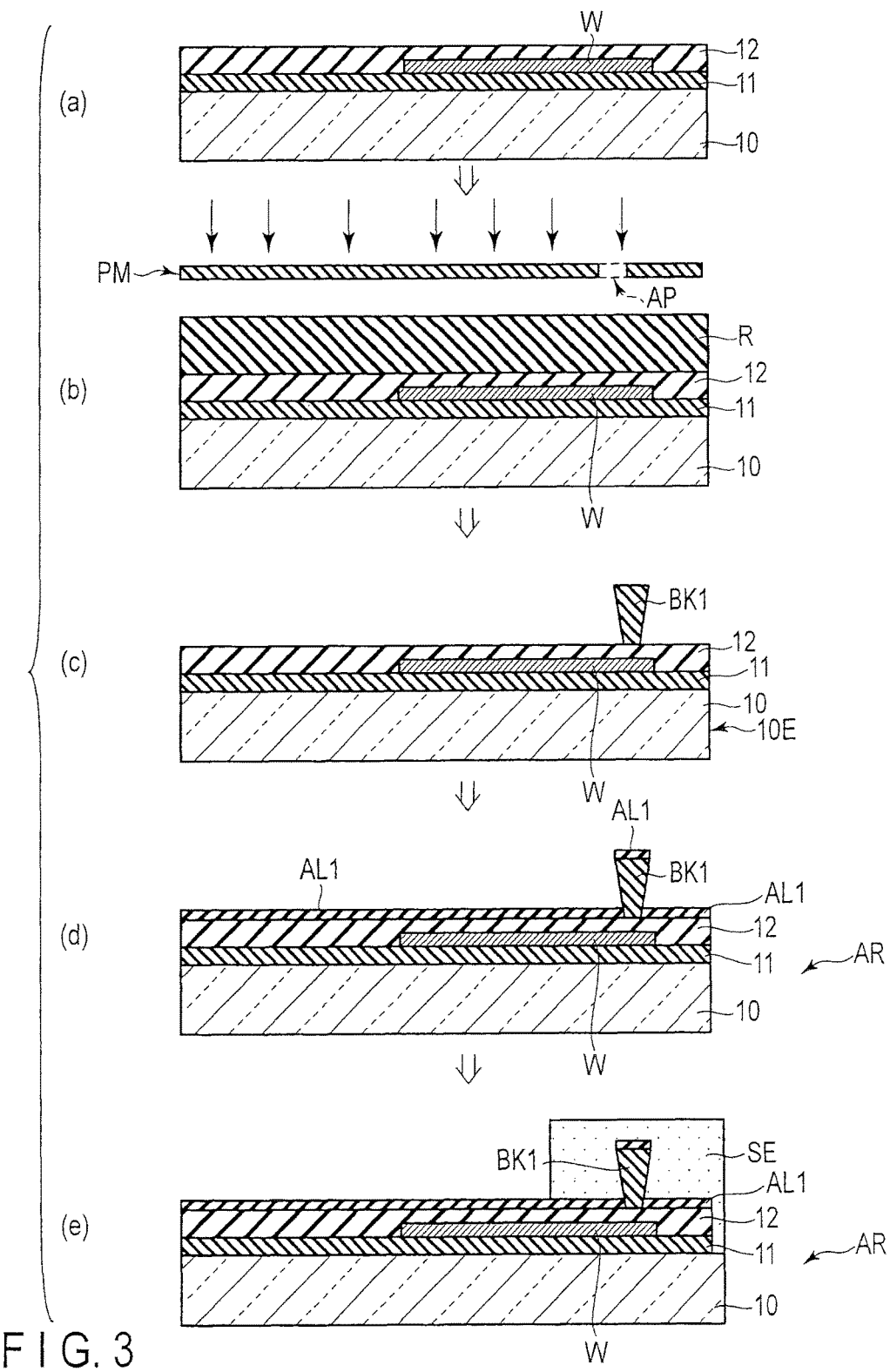
F I G. 3

DISPLAY DEVICE AND MANUFACTURING METHOD THEREOF

CROSS-REFERENCE TO RELATED APPLICATIONS

This application is a divisional of U.S. Ser. No. 14/097,927 filed Dec. 5, 2013. U.S. Ser. No. 14/097,927 claims the benefit of priority from Japanese Patent Application No. 2012-276969, filed Dec. 19, 2012, the entire contents of which are incorporated herein by reference.

FIELD

Embodiments described herein relate generally to a display device and a manufacturing method thereof.

BACKGROUND

In recent years, there has been an increasing demand for narrowing of picture frames of, in particular, display devices for mobile uses. Various techniques have been proposed for achieving the narrowing of picture frames. An example of such proposed techniques is a technique in which silicon dioxide is deposited and patterned, thereby forming double spacer walls, and a sealant is disposed between these spacer walls.

In modern display devices for mobile uses, an increase in fineness has been advanced, and such a design is required that the active area becomes larger and the picture frame portion of the peripheral area becomes narrower. Thus, in order to secure an aperture ratio (an area contributing to display) per pixel, it is dispensable to provide an optical layer (or an organic insulation film for planarizing a surface) immediately below a pixel electrode. Since this optical layer is used also as a protection layer of a driver which is disposed outside the active area, this optical layer is disposed also on the peripheral area.

In the meantime, in many cases, an aluminum (Al)-based wiring material is used for the wiring of display devices. Such a wiring material tends to be easily corroded due to the effect of moisture, etc. Of various resin-based materials (e.g. the above-described optical layer or alignment films) for use in display devices, some materials which are applied have water permeability. Thus, a wiring, which is formed of an aluminum-based wiring material, tends to be easily corroded due to moisture which permeates through the resin-based material. Such corrosion of various wirings leads to degradation in reliability, and may cause deterioration in display quality with the progress of corrosion.

BRIEF DESCRIPTION OF THE DRAWINGS

FIG. 3 is a view for describing fabrication steps of an array substrate AR.

DETAILED DESCRIPTION

Figure 1:
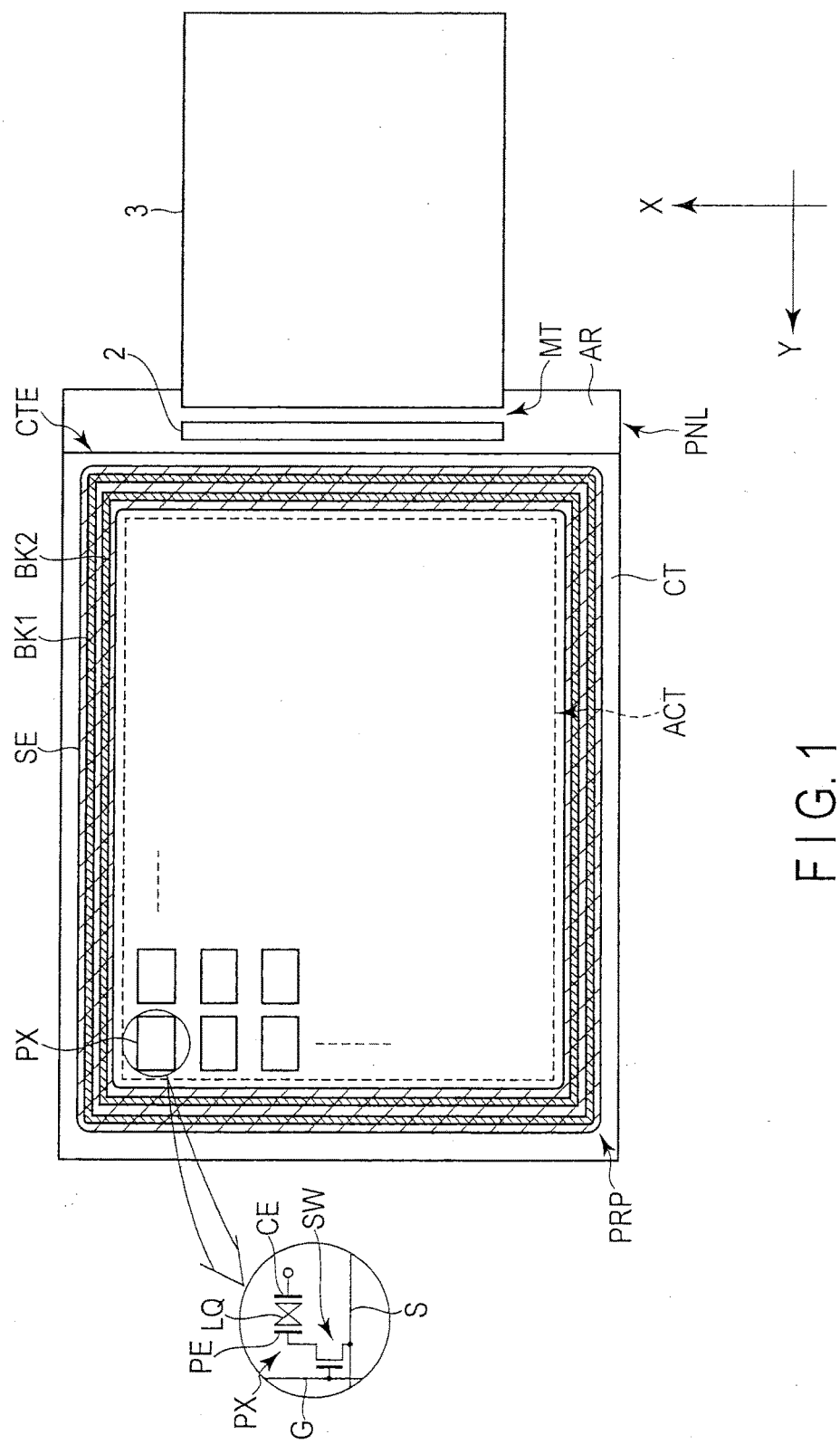
FIG. 1 is a plan view which schematically illustrates an example of a display panel PNL which is applicable to a display device according to an embodiment.

In general, according to one embodiment, a display device includes: a first substrate including a first insulative substrate, an outer peripheral wiring formed above the first insulative substrate, an insulation film disposed on the outer peripheral wiring, a pixel electrode formed on the insulation film in an active area for displaying an image, and a first bank formed in a line shape on the insulation film in a peripheral area surrounding the active area; a second substrate including at least a second insulative substrate; and a sealant which is provided in a manner to envelop the first bank, and which attaches the first substrate and the second substrate.

According to another embodiment, a manufacturing method of a display device, includes: preparing a first substrate configured such that an outer peripheral wiring is formed above a first insulative substrate, an insulation film is disposed on the outer peripheral wiring, a pixel electrode is formed on the insulation film in an active area for displaying an image, and a first bank having a line shape is formed on the insulation film in a peripheral area surrounding the active area; and attaching the first substrate and a second substrate including at least a second insulative substrate, by a sealant which is provided in a manner to envelop the first bank.

An embodiment will be described hereinafter with reference to the accompanying drawings. In the drawings, structural elements having the same or similar functions are denoted by like reference numerals, and an overlapping description is omitted.

FIG. 1 is a plan view which schematically illustrates an example of a display panel PNL which is applicable to a display device according to the embodiment.

An example of the display panel PNL, which will be described below, is an active-matrix-type liquid crystal display panel. Specifically, the display panel PNL includes an array substrate AR, a counter-substrate CT which is disposed to be opposed to the array substrate AR, and a liquid crystal layer LQ which is held between the array substrate AR and the counter-substrate CT. The array substrate AR and the counter-substrate CT are attached by a sealant SE in a state in which a predetermined cell gap is formed between the array substrate AR and the counter-substrate CT. The cell gap is formed by columnar spacers (not shown) which are formed on the array substrate AR or on the counter-substrate CT. The liquid crystal layer LQ is held in an inside surrounded by the sealant SE in the cell gap between the array substrate AR and the counter-substrate CT.

The display panel LPN includes an active area ACT, which displays an image, in the inside surrounded by the sealant SE. The active area ACT has, for example, a substantially rectangular shape, and is composed of a plurality of pixels PX which are arrayed in a matrix of m×n (m and n are positive integers).

The array substrate AR includes gate lines G extending in a first direction X, source lines S extending in a second direction Y and crossing the gate lines G, a switching element SW which is connected to the gate line G and source line S, and a pixel electrode PE which is connected to the switching element SW. A counter-electrode CE, which is opposed to each pixel electrode PE via the liquid crystal layer LQ, is provided, for example, on the counter-substrate CT, but the counter-electrode CE may be provided on the array substrate AR.

Although a description of the detailed structure of the liquid crystal panel PNL is omitted, the display panel PNL is configured such that a mode which mainly uses a vertical electric field, such as a TN (Twisted Nematic) mode, an OCB (Optically Compensated Bend) mode or a VA (Vertical Aligned) mode, or a mode which mainly uses a lateral electric field, such as an IPS (In-Plane Switching) mode or an FFS (Fringe Field Switching) mode, is applicable to the display panel PNL. In the structure in which a mode using a vertical electric field is applied, the pixel electrode PE is provided on the array substrate AR, and the counter-electrode CE is provided on the counter-substrate CT. In the structure in which a mode using a lateral electric field is applied, both the pixel electrode PE and counter-electrode CE are provided on the array substrate AR.

Signal supply sources which are necessary for driving the display panel PNL, such as a driving IC chip 2 and a flexible printed circuit (FPC) board 3, are located on a peripheral area PRP on the outside of the active area ACT. The signal supply sources include a gate driver which is connected to the gate lines G, a source driver which is connected to the source lines S, and a power supply module which supplies a common potential to the counter electrode CE. In the example illustrated, the driving IC chip 2 and FPC board 3 are mounted on a mounting portion MT of the array substrate AR, which extends outward from a substrate end portion CTE of the counter-substrate CT. The peripheral area PRP is an area surrounding the active area ACT. The peripheral area PRP includes an area on which the sealant SE is disposed, and is formed in a rectangular frame shape.

The sealant SE is formed in a rectangular frame shape or a loop shape surrounding the active area ACT. In addition, in the example illustrated, a first bank BK1 and a second bank BK2 are formed in the peripheral area PRP. Each of the first bank BK1 and second bank BK2 is formed in a rectangular frame shape surrounding the active area ACT. Specifically, each of the first bank BK1 and second bank BK2 includes portions formed in a line shape along the first direction X and the second direction Y. In the meantime, the first bank BK1 and second bank BK2 may be omitted at a short side along the mounting portion MT.

The first bank BK1 is formed, for example, on the array substrate AR, and the second bank BK2 is formed, for example, on the counter-substrate CT. In the X-Y plane, the first bank BK1 and second bank BK2 do not overlap, and a gap is formed between the first bank BK1 and second bank BK2. In addition, the first bank BK1 is located on that portion of the peripheral area PRP, which is on a panel end portion side (i.e. on a side away from the active area ACT), and the second bank BK2 is located on that portion of the peripheral area PRP, which is on a side close to the active area ACT (i.e. between the active area ACT and first bank BK1). Incidentally, the first bank BK1 and second bank BK2 are not limited to the example illustrated, and a plurality of first banks BK1 and a plurality of second banks BK2 may be provided.

A least one of the first bank BK1 and second bank BK2 is enveloped in the sealant SE, and it is desirable that the bank, which is located more on the outer side in the peripheral area PRP, be enveloped in the sealant SE. In the example illustrated, both the first bank BK1 and second bank BK2 are enveloped in the sealant SE, but it is desirable that at least the first bank BK1 be enveloped in the sealant SE.

Figure 2:
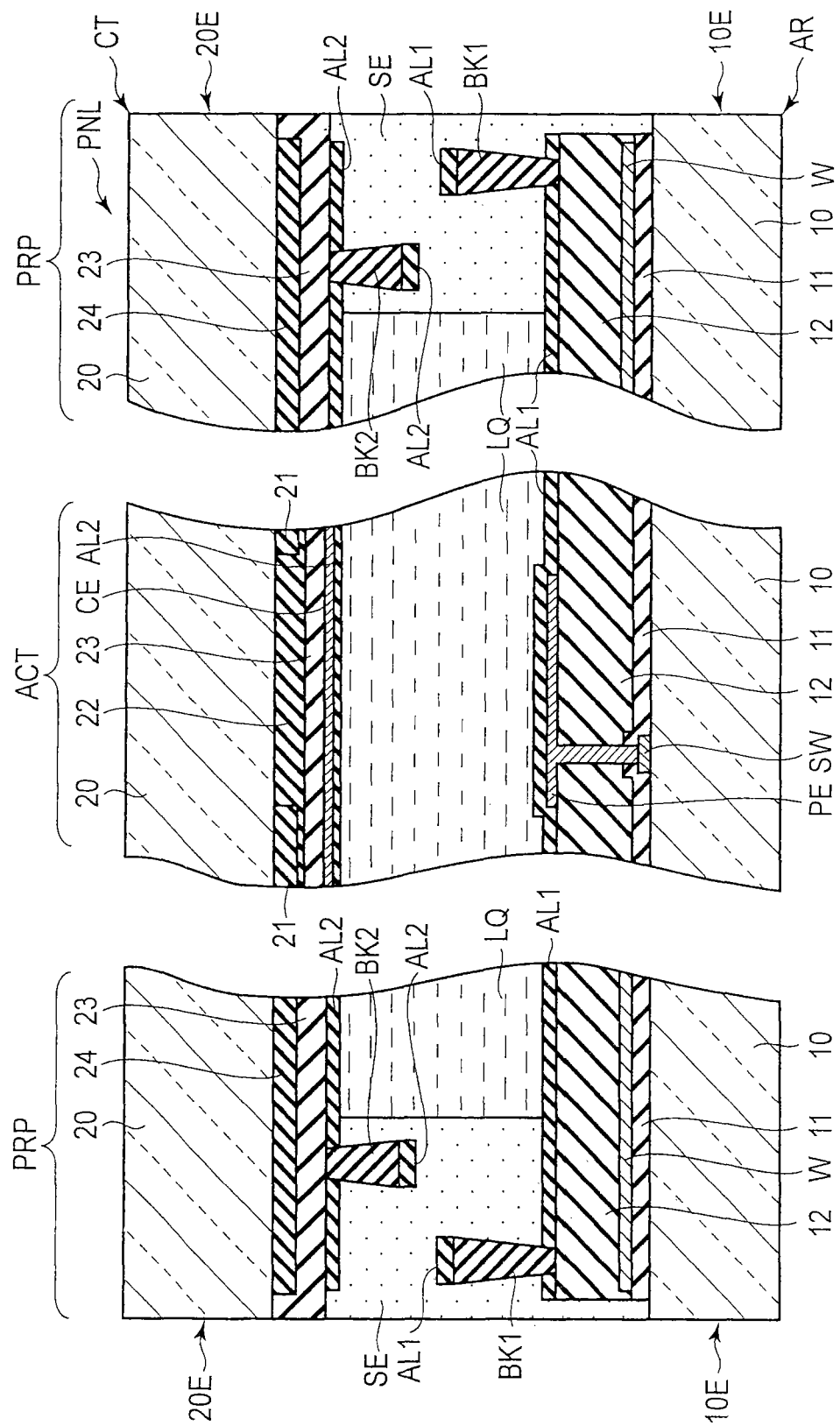
FIG. 2 is a cross-sectional view which schematically illustrates an example of the structure of the display panel PNL shown in FIG. 1.

FIG. 2 is a cross-sectional view which schematically illustrates an example of the structure of the display panel PNL shown in FIG. 1. FIG. 2 shows a cross section of a structure example in which the pixel electrode PE is provided on the array substrate AR, and the counter-electrode CE is provided on the counter-substrate CT.

The array substrate AR is formed by using a first insulative substrate 10 which is a transparent substrate such as a glass substrate. The array substrate AR includes, in the active area ACT, a first insulation film 11, a second insulation film 12, a switching element SW, a pixel electrode PE, and a first alignment film AL1, on that side of the first insulative substrate 10, which is opposed to the counter-substrate CT. In addition, the array substrate AR includes, in the peripheral area PRP, a first insulation film 11 and a second insulation film 12, which extend from the active area ACT, an outer peripheral wiring W, a first bank BK1 and a first alignment film AL1, on that side of the first insulative substrate 10, which is opposed to the counter-substrate CT.

The switching element SW is formed on the first insulative substrate 10 in the active area ACT. The switching element SW is a thin-film transistor including a semiconductor layer which is formed of, for example, polysilicon or amorphous silicon. In the meantime, another insulation film, such as an undercoat layer, may be interposed between the first insulative substrate 10 and the switching element SW.

The first insulation film 11 is an interlayer insulation film, and covers the switching element SW. In addition, the first insulation film 11 extends not only on the active area ACT, but also on the peripheral area PRP, and is also disposed on the first insulative substrate 10. The first insulation film 11 is formed of, for example, an inorganic material such as silicon oxide (SiO) or silicon nitride (SiN), and the first insulation film 11 may be a single layer of an insulation layer formed of an inorganic material, or a multilayer of a plurality of insulation layers formed of an inorganic material.

The outer peripheral wiring W is formed on the first insulation film 11. The outer peripheral wiring W is formed of a wiring material in the same layer as the gate lines G and source lines S. Examples of the wiring material, which is applied to the outer peripheral wiring W, include single substances or alloys of aluminum (Al), molybdenum (Mo), tungsten (W), titanium (Ti) and silver (Ag). The outer peripheral wiring W may be a single layer of a wiring material, or a multilayer of a plurality of wiring materials. In the meantime, the outer peripheral wiring W may be a simple wiring of a desired potential, or may be various circuits disposed in the peripheral area PRP.

The second insulation film 12 is an interlayer insulation film, extends not only on the active area ACT but also on the peripheral area PRP, and is also disposed on the first insulation film 11. In addition, the second insulation film 12 covers the outer peripheral wiring W in the peripheral area PRP. To be more specific, the second insulation film 12 covers the upper surface and side surface of the outer peripheral wiring W. Thus, the outer peripheral wiring W is not exposed to the outside, and is not exposed to the outside air or moisture contained in the outside air. The second insulation film 12 planarizes a surface thereof, and is formed of, for example, an organic material such as a transparent resin, but it is desirable that this material be a material with low water permeability. In the meantime, the second insulation film 12 may be formed of an inorganic material with low water permeability, or may be formed of a material with high filling density. By applying the second insulation film 12 formed of such material, it becomes possible to suppress permeation of moisture via the second insulation film 12. In addition, by the second insulation film 12 covering the outer peripheral wiring W, it becomes possible to suppress corrosion of the outer peripheral wiring W due to moisture via the second insulation film 12.

The pixel electrode PE is formed on the second insulation film 12 in the active area ACT. The pixel electrode PE is connected to the switching element SW via a contact hole which penetrates the first insulation film 11 and second insulation film 12. The material, of which the pixel electrode PE is formed, may be a transparent, electrically conductive material such as indium tin oxide (ITO), or a reflective metallic material such as aluminum.

The first bank BK1 is formed on the second insulation film 12 in the peripheral area PRP. As illustrated in the Figure, the first bank BK1 has an inverse-taper cross-sectional shape which is larger at a top surface thereof on the counter-substrate CT side than at a bottom surface thereof which is in contact with the second insulation film 12. In the meantime, it is desirable that the first bank BK1 be located on that area of the second insulation film 12, which is close to a substrate end portion 10E of the first insulative substrate 10. The first bank BK1 is formed of, for example, a resin material.

The first alignment film AL1 extends over the active area ACT, covers the pixel electrode PE, and is disposed on the second insulation film 12. In addition, the first alignment film AL1 extends over the peripheral area PRP, is disposed on the second insulation film 12, and is also disposed on the top surface of the first bank BK1. It should be noted, however, that the first alignment film AL1 is discontinuous at a side surface connecting the bottom surface and top surface of the first bank BK1. Specifically, the first bank BK1 having the inverse-taper cross section is not completely covered with the first alignment film AL1. The first alignment film AL1 is divided between the portion thereof remaining on the top surface of the first bank BK1 and the portion thereof disposed on the second insulation film 12.

On the other hand, the counter-substrate CT is formed by using a second insulative substrate 20 which is a transparent substrate such as a glass substrate. The counter-substrate CT includes, in the active area ACT, a black matrix 21, a color filter 22, an overcoat layer 23, a counter-electrode CE, and a second alignment film AL2, on that side of the second insulative substrate 20, which is opposed to the array substrate AR. In addition, the counter-substrate CT includes, in the peripheral area PRP, a peripheral light-shield layer 24, an overcoat layer 23 extending from the active area ACT, and a second alignment film AL2, on that side of the second insulative substrate 20, which is opposed to the array substrate AR.

The black material 21 and peripheral light-shield layer 24 are formed on that side of the second insulative substrate 20, which is opposed to the array substrate AR. In the active area ACT, the black matrix 21 is opposed to wiring portions such as the gate lines G, source lines S and switching elements SW, and is formed in a grid shape. The peripheral light-shield layer 24 extends over substantially the entirety of the peripheral area PRP, and is continuous with the black matrix 21 of the active area ACT. The peripheral light-shield layer 24 is formed of, for example, a black-colored resin material, or a light-shielding metallic material such as chromium (Cr).

The color filter 22 is formed, in the active area ACT, on that side of the second insulative substrate 20, which is opposed to the array substrate AR. The color filter 22 is formed of, for example, resin materials which are colored in red, green and blue.

The overcoat layer 23 extends over the active area ACT, and covers the color filter 22. In addition, the overcoat layer 23 extends over the peripheral area PRP, and covers the peripheral light-shield layer 24. The overcoat layer 23 is formed of, for example, a transparent resin material.

The counter-electrode CE is formed, in the active area ACT, on that side of the overcoat layer 23, which is opposed to the array substrate AR. The counter-electrode CE is formed of a transparent, electrically conductive material such as ITO.

The second bank BK2 is formed on the overcoat layer 23 in the peripheral area PRP. As illustrated in the Figure, the second bank BK2 has an inverse-taper cross-sectional shape which is larger at a top surface thereof on the array substrate AR side than at a bottom surface thereof which is in contact with the overcoat layer 23. In the meantime, the second bank BK2 is located on that area of the overcoat layer 23, which is close to a substrate end portion 20E of the second insulative substrate 20, but is located at a position different from a position immediately above the first bank BK1. In the example illustrated, the second bank BK2 is located on the active area ACT side of the position immediately above the first bank BK1. The second bank BK2, like the first bank BK1, is formed of, for example, a resin material.

The second alignment film AL2 extends over the active area ACT, and covers the counter-electrode PE. In addition, the second alignment film AL2 extends over the peripheral area PRP, covers the overcoat layer 23, and is also disposed on the top surface of the second bank BK2. It should be noted, however, that the second alignment film AL2 is discontinuous at a side surface connecting the bottom surface and top surface of the second bank BK2. Specifically, the second bank BK2 having the inverse-taper cross section is not completely covered with the second alignment film AL2. The second alignment film AL2 is divided between the portion thereof remaining on the top surface of the second bank BK2 and the portion thereof covering the overcoat layer 23.

The above-described array substrate AR and counter-substrate CT are disposed such that the first alignment film AL1 and second alignment film AL2 are opposed to each other, and the array substrate AR and counter-substrate CT are attached by the sealant SE in the state in which a predetermined cell gap is created by columnar spacers (not shown). The first bank BK1 and second bank BK2 are enveloped in the sealant SE. Specifically, the side surface of the first bank BK1, which is exposed from the first alignment film AL1, and the side surface of the second bank BK2, which is exposed from the second alignment film AL2, are covered with the sealant SE. In addition, in the example illustrated, those end faces of the first insulation film 11, second insulation film 12 and first alignment film AL1, which are close to the substrate end portion 10E, are covered with the sealant SE. Besides, that end face of the second alignment film AL2, which is close to the substrate end portion 20E, is also covered with the sealant SE.

The height of at least one of the first bank BK1 and second bank BK2 is less than the cell gap between the array substrate AR and counter-substrate CT. Specifically, the height of at least one of the first bank BK1 and second bank BK2 is equal to or less than the cell gap.

In the example illustrated, the height of each of the first bank BK1 and second bank BK2 is less than the cell gap. Specifically, the first bank BK1 is not in contact with the counter-substrate CT. The sealant SE lies between the first bank BK1 and the counter-substrate CT. As an example of the case in which the first bank BK1 is not in contact with the counter-substrate CT, it is desirable that the height of the first bank BK1 be about 50% to 60% of the cell gap. In addition, the second bank BK2 is not in contact with the array substrate AR. The sealant SE lies between the second bank BK2 and the array substrate AR. As an example of the case in which the second bank BK2 is not in contact with the array substrate AR, it is desirable that the height of the second bank BK2 be about 50% to 60% of the cell gap.

The liquid crystal layer LQ is sealed in the cell gap in an inside surrounded by the sealant SE.

Although not shown, an optical element including a polarizer is attached to each of an outer surface of the first insulative substrate 10 and an outer surface of the second insulative substrate 20.

Next, an example of the manufacturing method of the above-described display panel PNL is described. When the display panel PNL is manufactured, there is a case of adopting such a method that a first mother-substrate for forming a plurality of array substrates AR in a batchwise manner, and a second mother-substrate for forming a plurality of counter-substrates CT in a batchwise manner, are prepared, these first mother-substrate and second mother-substrate are attached, and then the attached structure is cut into single display panels PNL. In this example, this method is described in a simplified manner.

FIG. 3 is a view for describing fabrication steps of the array substrate AR. In particular, by referring to a cross section of the peripheral area, the fabrication steps of the array substrate AR are described.

To begin with, as illustrated in part (a) of FIG. 3, after a first insulation film 11 is formed on the first insulative substrate 10, various wirings, such as gate lines and source lines, in addition to an outer peripheral wiring W, are formed on the first insulation film 11. Then, a second insulation film 12 is formed. Although depiction is omitted, in these fabrication steps, a switching element SW is formed at the same time, and a contact hole penetrating to the switching element SW is also formed. The film thickness of the first insulation film 11 is about 600 nm. The second insulation film 12 may be formed of an inorganic material, or may be formed of an organic material. Thereafter, although depiction is omitted, a pixel electrode PE is formed on the second insulation film 12, and the pixel electrode PE is electrically connected to the switching element SW via the contact hole.

Subsequently, as illustrated in part (b) of FIG. 3, a resist R is coated on the second insulation film 12. The method of coating the resist R is not particularly limited. For example, a method using a slit coater or a spin coater is applicable. As the resist R, for example, a negative-type photoresist, which is cured by light radiation, is applicable. After the resist R is coated, the resist R is exposed via a photomask PM on which a desired aperture pattern AP is formed. As the photomask PM, for example, a halftone mask, which is capable of halftone exposure, is applicable. Specifically, the aperture pattern AP of the photomask PM is formed, for example, such that the transmittance of a peripheral part thereof is lower than the transmittance of a central part thereof. Curing progresses in that area of the resist R, which has been exposed via the aperture pattern AP. At this time, since the radiation intensity of light, which has passed through the central part of the aperture pattern AP, is strong, curing progresses to a deep part of the resist R. On the other hand, since the radiation intensity of light, which has passed through the peripheral part of the aperture pattern AP, is weak, a surface portion of the resist R is cured, but curing does not progress to a deep part of the resist R.

Following the above, as shown in part (c) of FIG. 3, by developing the resist R, a first bank BK1 is formed on the second insulation film 12. Specifically, by the development process, the non-cured portion of the resist R is removed, and only the cured portion is left as a portion having an inverse-taper cross-sectional shape. Thus, the first bank BK1 having a line shape surrounding the active area is formed. This first bank BK1 is formed, for example, at a distance of about 100 μm from the substrate end portion 10E of the first insulative substrate 10.

Then, as illustrated in part (d) of FIG. 3, an alignment film material is printed from above the second insulation film 12 and the first bank BK1. The printing of the alignment film material is performed batchwise, not only on the peripheral area but also on the active area. The film thickness of the printed alignment film material is, for example, about 0.05 μm to 0.1 μm. This printed alignment film material is disposed on the second insulation film 12, and is also disposed on the top surface of the first bank BK1. In addition, although not illustrated, in the active area, the alignment film material is also disposed on the pixel electrode PE. On the other hand, since the first bank BK1 is formed in the inverse-taper shape, the printed alignment film material is not coated on the side surface of the first bank BK1. Thus, in the peripheral area, the first alignment film AL1 is divided between the inside (i.e. the side neighboring the active area) and the outside (the substrate end side of the first insulative substrate 10), with the first bank BK1 being interposed. Specifically, the first alignment film AL1, which is located on the inside surrounded by the first bank BK1, is not continuous with the area outside the first bank BK1. In the meantime, the first alignment film AL1 may be subjected to alignment treatment such as rubbing or optical alignment, where necessary.

Through the above steps, the array substrate AR is fabricated.

Subsequently, as illustrated in part (e) of FIG. 3, a sealant SE is coated. The sealant SE may be drawn by using a dispenser, or may be printed by using a print plate. This sealant SE is formed in a rectangular frame shape surrounding the active area in a manner to envelop the first bank BK1.

Figure 4:
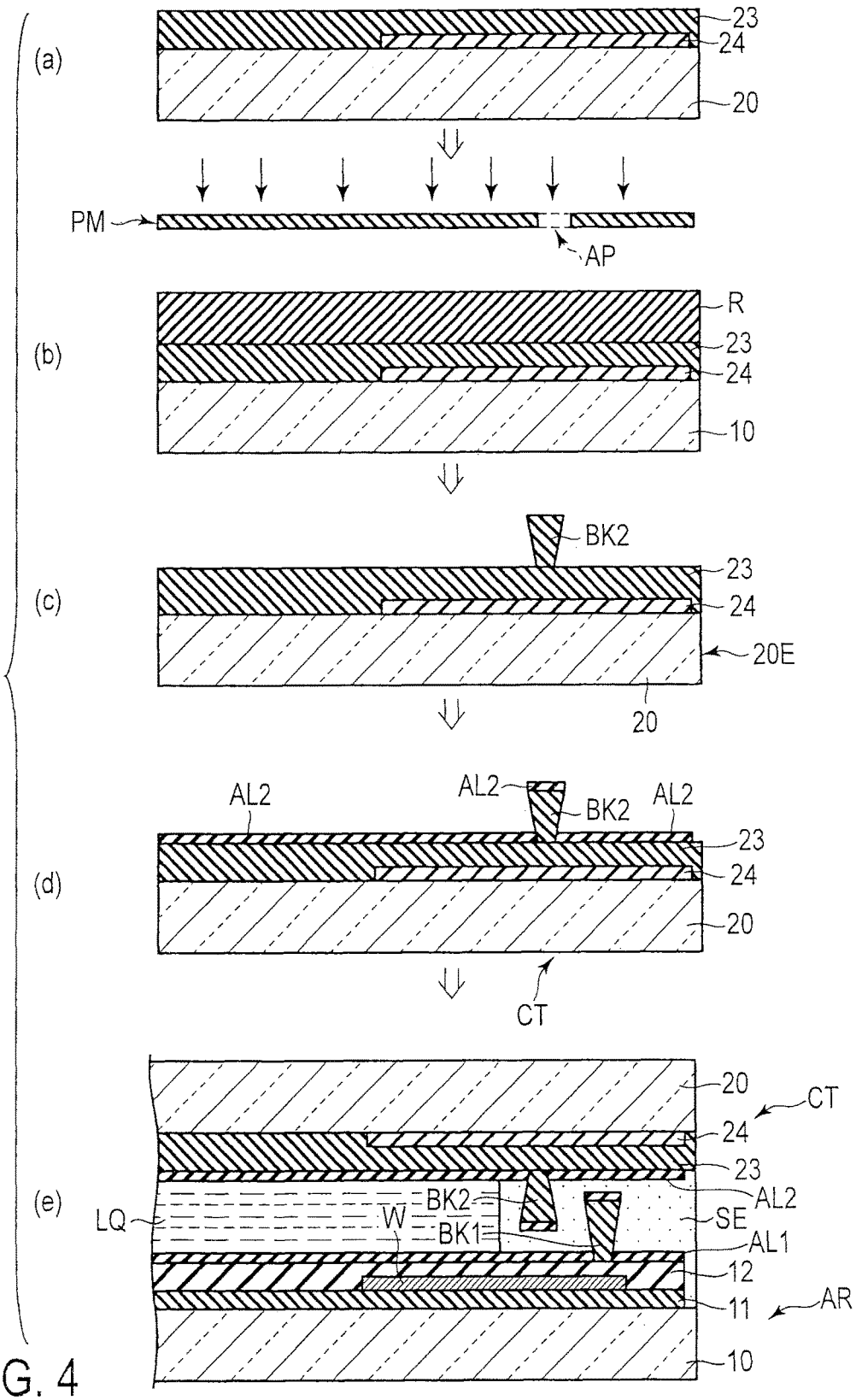
FIG. 4 is a view for describing fabrication steps of a counter-substrate CT.

FIG. 4 is a view for describing fabrication steps of the counter-substrate CT. In particular, by referring to a cross section of the peripheral area, the fabrication steps of the counter-substrate CT are described.

To begin with, as illustrated in part (a) of FIG. 4, after a peripheral light-shield layer 24, in addition to a black matrix and a color filter (not shown), is formed on the second insulative substrate 20, an overcoat layer 23 is formed. Then, although not illustrated, a counter-electrode CE is formed on the overcoat layer 23.

Subsequently, as illustrated in part (b) of FIG. 4, a resist R is coated on the overcoat layer 23. As the method of coating the resist R, for example, as described above, a method using a slit coater or a spin coater is applicable. As the resist R, for example, a negative-type photoresist is applicable. After the resist R is coated, the resist R is exposed via a photomask PM on which a desired aperture pattern AP is formed. The aperture pattern AP of the photomask PM is formed, for example, such that the transmittance of a peripheral part thereof is lower than the transmittance of a central part thereof. Curing progresses in that area of the resist R, which has been exposed via the aperture pattern AP.

Following the above, as shown in part (c) of FIG. 4, by developing the resist R, a second bank BK2 is formed on the overcoat layer 23. Specifically, by the development process, the non-cured portion of the resist R is removed, and only the cured portion is left as a portion having an inverse-taper cross-sectional shape. Thus, the second bank BK2 having a line shape surrounding the active area is formed. This second bank BK2 is formed, for example, at a distance of about 150 μm from the substrate end portion 20E of the second insulative substrate 20.

Then, as illustrated in part (d) of FIG. 4, an alignment film material is printed from above the overcoat layer 23 and second bank BK2. The printing of the alignment film material is performed batchwise, not only on the peripheral area but also on the active area. The film thickness of the printed alignment film material is, for example, about 0.05 μm to 0.1 μm. This printed alignment film material is disposed on the overcoat layer 23, and is also disposed on the top surface of the second bank BK2. In addition, although not illustrated, in the active area, the alignment film material is also disposed on the counter-electrode CE. On the other hand, since the second bank BK2 is formed in the inverse-taper shape, the printed alignment film material is not coated on the side surface of the second bank BK2. Thus, in the peripheral area, the second alignment film AL2 is divided between the inside (i.e. the side neighboring the active area) and the outside (the substrate end side of the second insulative substrate 20), with the second bank BK2 being interposed. Specifically, the second alignment film AL2, which is located on the inside surrounded by the second bank BK2, is not continuous with the area outside the second bank BK2. In the meantime, the second alignment film AL2 may be subjected to alignment treatment, where necessary.

Through the above steps, the counter-substrate CT is fabricated.

Subsequently, as illustrated in part (e) of FIG. 4, the above-described array substrate AR and counter-substrate CT are attached. At this time, use may be made of a method in which a sealant SE in a closed loop shape is formed on the array substrate AR, and a liquid crystal material is dispensed in the inside surrounded by the sealant SE, and then the array substrate AR and counter-substrate CT are attached, or a method in which a sealant SE having a liquid crystal injection port is formed on the array substrate AR, the array substrate AR and counter-substrate CT are attached, and then a liquid crystal material is injected from the liquid crystal injection port and is sealed. Thereby, the display panel PNL having the cross-sectional structure as shown in FIG. 2 is manufactured.

According to the present embodiment, the array substrate AR includes the first bank BK1 which has an inverse-taper cross section and is formed in a line shape in the peripheral area PRP surrounding the active area ACT, and the first alignment film AL1 which covers the pixel electrode PE in the active area ACT and is discontinuous at the side surface of the first bank BK1. Specifically, the first alignment film AL1 is divided between the inside area and the outside area of the first bank BK1.

Thereby, even if an end portion of the first alignment film AL1 is exposed to the outside, it is possible to prevent moisture, which has permeated from the end portion of the first alignment film AL1, from further permeating into the inside of the first bank BK1. Thus, it is possible to suppress corrosion of wiring due to moisture which has permeated through the first alignment film AL1. Therefore, it is possible to suppress degradation in reliability due to corrosion of wiring, and to suppress degradation in display quality.

By way of example, the display panel PNL of the embodiment, which was manufactured by the above-described manufacturing method, and a display panel of a comparative example, which includes neither the first bank BK1 nor the second bank BK2, were prepared. After these display panels were formed as modules, the display panels were subjected to a reliability test. According to the display panel of the comparative example, the time needed until corrosion occurs varied in the range of five times to seven times. On the other hand, it was successfully confirmed that there occurred substantially no corrosion in the display panel PNL of the embodiment.

In particular, in recent years, there has been an increasing demand for such narrowing of a picture frame that the distance from the sealant SE to the substrate end portion 10E and substrate end portion 20E is short. In many cases, the materials used in the liquid crystal display device include materials with relatively high water permeability, such as materials of organic insulation films and alignment films. There is a concern that corrosion of wiring occurs due to moisture which has permeated through such films. As a countermeasure to such moisture, an examination has been conducted on devices in design of the sealant SE for attaching the array substrate AR and counter-substrate CT, and the end portion of the water-permeable film (for example, a structure in which the end portion of the film is not exposed to the outside, or the end portion of each film is covered with the sealant SE that is formed of a material with relatively low water permeability). However, as the picture frame width becomes smaller, the area size of the peripheral area PRP becomes smaller with a less margin, and the demand for processing precision or attachment precision becomes higher. Thus, the adoption of the structure in which the end portion of each film not exposed to the outside becomes difficult, and may become a hindrance to a narrower picture frame.

In the present embodiment, the end portion of the planarization layer, which has been described as the second insulation film 12, can be finely processed by applying a photosensitive material to the planarization layer. Thus, this planarization layer can meet the present demand for a narrower picture frame. On the other hand, as the material of which the second insulation film 12 is formed, not only the organic material but also an inorganic material or a material with a high filling density may be applied, and thereby it is possible to decrease the water permeability and to suppress the permeation of moisture through the second insulation film 12 even if the end portion is not finely processed (or even if the structure in which the end portion is exposed to the outside is adopted).

On the other hand, high precision is required in order to print and form the first alignment film AL1 only in the active area ACT and the vicinity of its periphery (i.e. in order to form the first alignment film AL1 such that the end portion thereof is not exposed to the outside). For example, in the case where misalignment in printing from a desired location has occurred when the first alignment film AL1 is printed, there is a concern that an end portion of at least a part of the first alignment film AL1 is exposed to the outside. Since the material, of which the alignment film is formed, has to be a material having a desired alignment capability for liquid crystal molecules, it is difficult to select a material having both moisture impermeability and high alignment properties, and the development of such materials requires a great deal of money, leading to an increase in cost.

To deal with this challenge, in the present embodiment, the alignment film material is printed over the entire active area ACT and peripheral area PRP by a relatively rough printing technique, thereby forming the first alignment film AL1. As regards the alignment material, a material having necessary alignment capability is applied. Although there is a case in which the printed alignment film material is disposed on the top surface of the first bank BK1 having the inverse-taper cross section, the alignment film material is discontinuous at the side surface of the first bank BK1. Specifically, the first bank BK1 divides the first alignment film AL1, which is located on the inside of the first bank BK1, and the first alignment film AL1, which is located on the outside of the first bank BK1. It is thus possible to shut off the path of permeation of moisture which has permeated from the first alignment film AL1 that is located on the outside of the first bank BK1.

Therefore, while the suppression of degradation in reliability and deterioration in display quality can be realized, the increase in cost can be suppressed since a high-cost alignment film material is not necessary, and a narrower picture frame is possible.

In addition, since the first bank BK1 is formed in a continuous frame shape surrounding the active area ACT, the first bank BL1 can divide the region located outside the first bank BK1 and the region located inside the first bank BK1 over the entire periphery of the first alignment film AL1, and the permeation path of moisture can be made smaller.

The first bank BK1 is located on the substrate end side of the array substrate. Specifically, the first bank BK1 can shut off the permeation path of moisture at a position closer to the end portion of the display panel PNL, and can more effectively suppress the permeation of moisture into the first alignment film AL1.

Moreover, since the counter-substrate CT includes the similar second bank BK2, the permeation path of moisture through the second alignment film AL2 can be shut off.

Furthermore, the sealant SE, which attaches the array substrate AR and counter-substrate CT, envelops at least one of the first bank BK1 and second bank BK2. Thus, the contact area of the sealant SE increases in accordance with the surface area of at least one of the first bank BK1 and second bank BK2. Accordingly, it is possible to enhance the adhesion force between the array substrate AR and counter-substrate CT by the sealant SE.

Besides, at least one of the first bank BK1 and second bank BK2 has a height which is less than the cell gap, and is not in contact with the opposed substrate. Specifically, the sealant SE lies between the first bank BK1 and counter-substrate CT, or between the second bank BK2 and array substrate AR. It is thus possible to increase the sealant SE which is in contact with the array substrate AR or counter-substrate CT, and to improve the adhesion force by the sealant SE.

As has been described above, according to the present embodiment, it is possible to provide a display device and a manufacturing method thereof, which can suppress degradation in reliability and to suppress deterioration in display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
  a first substrate including a first insulative substrate, a plurality of pixels in an active area, and a first bank having a wall shape above the first insulative substrate in a peripheral area surrounding the active area;
  a second substrate including at least a second insulative substrate; and
  a sealant which is provided in a manner to envelop the first bank, and which attaches the first substrate and the second substrate in the peripheral area,
  wherein the first bank is spaced apart from the second substrate by the sealant,
  the second substrate further includes a second bank which has a wall shape, and is enveloped in the sealant in the peripheral area,
  the second bank is spaced apart from the first substrate by the sealant,
  each of the pixels includes a pixel electrode formed above the first insulative substrate, and
  the first substrate further includes a first alignment film which covers the pixel electrode, extends to the peripheral area, and overlaps with the sealant in the peripheral area.

2. The display device of claim 1, wherein the second substrate further includes a second alignment film which is disposed on a side of the second insulative substrate which faces the first substrate, the second alignment film being opposed to the first alignment film and being overlapped with the sealant.

3. The display device of claim 1, wherein the second bank is formed at a position different from a position immediately above the first bank.

4. The display device of claim 1, wherein the first bank is located closer to an end position of the first insulative substrate than the second bank.

5. The display device of claim 1, wherein at least one of the first bank and the second bank has a height which is less than a gap between the first substrate and the second substrate, the first bank extends from a first surface of the first substrate towards a second surface of the second substrate and is spaced apart from the second surface by a first space that is filled by the sealant such that the first surface is opposing the second surface, and the second bank extends from the second surface towards the first surface and is spaced apart from the first surface by a second space that is filled by the sealant.

6. The display device of claim 5, wherein the first bank has a cross section of a substantially inverse taper shape, and a first width of the first bank of the first surface side is smaller than a second width of the first bank of the second surface side in a cross section view.

7. The display device of claim 5, wherein the second bank has a cross section of a substantially inverse taper shape, and a third width of the second bank of the second surface side is smaller than a fourth width of the second bank of the first surface side in a cross section view.

8. The display device of claim 1, further comprising a liquid crystal layer held in an inside surrounded by the sealant.

9. The display device of claim 1, wherein the first bank and the second bank extend in a same direction.

10. The display device of claim 1, wherein the first bank and the second bank extend in a first direction and are arranged in a second direction crossing the first direction.

11. A display device comprising:
  a first substrate including a first insulative substrate, a plurality of pixels in an active area, and a first bank having a wall shape above the first insulative substrate in a peripheral area surrounding the active area;
  a second substrate including at least a second insulative substrate; and
  a sealant which is provided in a manner to envelop the first bank, and which attaches the first substrate and the second substrate in the peripheral area, wherein the first bank is spaced apart from the second substrate by the sealant, the second substrate further includes a second bank which has a wall shape, and is enveloped in the sealant in the peripheral area, the second bank is spaced apart from the first substrate by the sealant, and the first bank and the second bank do not extend between adjacent pixels.

12. A display device comprising:

a first substrate including a first insulative substrate, a plurality of pixels in an active area, and a first bank having a wall shape above the first insulative substrate in a peripheral area surrounding the active area;

a second substrate including at least a second insulative substrate; and a sealant which is provided in a manner to envelop the first bank, and which attaches the first substrate and the second substrate in the peripheral area, wherein the first bank is spaced apart from the second substrate by the sealant, the second substrate further includes a second bank which has a wall shape, and is enveloped in the sealant in the peripheral area, the second bank is spaced apart from the first substrate by the sealant, the first bank and the second bank have a first length in a first direction, the pixels have a second length in the first direction, and the first length is greater than the second length.

13. The display device of claim 12, wherein the first length is greater than twice the second length.

14. The display device of claim 12, wherein the sealant does not extend in the active area.

* * * * *